United States Patent
Oka et al.

(10) Patent No.: US 6,169,402 B1
(45) Date of Patent: Jan. 2, 2001

(54) NUCLEAR MAGNETIC RESONANCE SPECTROMETER

(75) Inventors: Tetsuo Oka, Oobu; Yoshitaka Ito; Yousuke Yanagi, both of Chiryu; Masaaki Yoshikawa, Kariya; Ryohei Yabuno, Toyota; Jun Uzawa, Wako, all of (JP)

(73) Assignees: Aisin Seiki Kabushiki Kaisha, Kariya; The Institute of Physical and Chemical Research, Wako, both of (JP)

( * ) Notice: Under 35 U.S.C. 154(b), the term of this patent shall be extended for 0 days.

(21) Appl. No.: 09/257,192

(22) Filed: Feb. 25, 1999

(30) Foreign Application Priority Data

Feb. 27, 1998 (JP) .................................................. 10-061895

(51) Int. Cl.[7] ...................................................... G01V 3/00
(52) U.S. Cl. ............................................ 324/318; 324/321
(58) Field of Search .................................... 324/318, 319, 324/320, 322; 335/216; 62/51.1

(56) References Cited

U.S. PATENT DOCUMENTS

| 5,417,073 | * | 5/1995 | James et al. | 62/51.1 |
| 5,563,564 | * | 10/1996 | Chu et al. | 335/216 |
| 5,764,121 | * | 6/1998 | Wheatley et al. | 335/26 |

FOREIGN PATENT DOCUMENTS 9-135823   5/1997   (JP) .

* cited by examiner

*Primary Examiner*—Louis Arana
(74) *Attorney, Agent, or Firm*—Oblon, Spivak, McClelland, Maier & Neustadt, P.C.

(57) ABSTRACT

A magnet for producing a static magnetic field is improved, and a small-sized, high-resolution nuclear magnetic resonance system is provided. A superconductive bulk (17) of a high-temperature superconductor is cooled in a vacuum insulated container (16), and magnetized with a magnetizing coil (19). This is used for analyzing a subject (11).

31 Claims, 3 Drawing Sheets

NUCLEAR MAGNETIC RESONANCE SPECTROMETER

BACKGROUND OF THE INVENTION

The present invention relates to a nuclear magnetic resonance (NMR) system or spectrometer for use in the field of medical treatment and also for component and structure analysis of industrial materials, farm products and others.

An NMR system gives various data useful for the structure analysis of most organic compounds, for example, the degree of chemical shift of each atom, spin—spin coupling constants relaxation time, etc. The NMR system is basically composed of a magnet for generating a static magnetic field, a coil for generating a different radio-frequency magnetic field pulse to detect NMR signals, a receiver for receiving the NMR signals, a system controller, etc. In a stronger magnetic field, the NMR system gives a greater amount of information data for more detailed analysis of samples. The magnet, used in NMR systems is therefore preferably a superconducting magnet in view of the intensity, the stability and the homogeneity of the magnetic field produced by a magnet of this type.

A magnetic resonance imaging (MRI) system is one typical application of NMR to medical treatment, in which the magnetic resonance occurring in the human body is utilized so as to directly trace the chemical reaction having occurred in tissues or organs to give, for example, encephalophotoscopic laminagraphy images.

The MRI system comprises at least a magnet for generating a static magnetic field, magnetic field gradients for giving positional information to NMR signals, a radio-frequency oscillator unit, an NMR signal detector unit, a probe coil that surrounds the subject to be examined, for example, a human body or the like, for radiating radio-frequency electromagnetic waves and detecting signals, and a controller for controlling those units and processing the signals obtained. In operation of the MRI system high-frequency electromagnetic waves are used to irradiate the subject placed in the static magnetic field to produce NMR signals and the space distribution of the nuclides having generated the signals is imaged. The MRI system is safe as no harmful radiation is used, and, in addition, its resolving power is high. The practical value of the system is therefore extremely high.

In many conventional instruments for analysis based on NMR and MRI systems a superconducting magnet is used that comprises a superconducting coil of a metallic superconducting wire material of, for example, niobium, titanium or the like, for producing the main magnetic field. Such coils are cooled with liquid helium to be at an ultra-low temperature. Therefore, they require a large amount of expensive liquid helium, and are problematic in that their running cost is high. The metallic superconducting wire material of niobium, titanium or the like is produced in a complicated process that comprises specific heat treatment. Therefore, the superconducting coil is much more expensive than copper coils used in ordinary electromagnets, and the utilizing systems are extremely expensive. In addition, driving the superconducting magnet requires cryogen gases (liquid helium and liquid nitrogen), for which a specific operation technique is necessary. From the above it is clear that the technique of using a superconducting magnet is complicated, expensive and highly problematic. These problems are serious and present a barrier to the popularization of high-performance NMR and MRI systems.

One example of a small-sized and simple NMR system has been proposed in Japanese Patent Laid-Open Publication No. Hei 9-135823, in which a direct-cooling type superconducting magnet by using refrigerators is used in place of the conventional helium-cooling type superconducting magnet as the main magnetic field generating source, and forms a simple NMR system for medical treatment, as compared with conventional large-sized NMR systems.

The NMR system proposed is operated in a more simplified manner than the NMR systems having a conventional helium-cooling type superconducting magnet. However, a superconducting coil of a superconducting wire material is still used for producing the main magnetic field. The superconducting wire material is extremely expensive, and therefore the system which comprises a superconducting coil of the wire material is also expensive. In addition, since the superconducting coil housed in a vacuum container is cooled with a refrigerator, the coil unit is large and therefore reduces the advantages and simplicity of the system. Moreover, the superconducting coil in the system has a large heat capacity and therefore takes a long time until it is cooled with a refrigerator to a predetermined temperature when actual measurement can be made. Thus, the system still has various problems.

SUMMARY OF THE INVENTION

The present invention provides a nuclear magnetic resonance apparatus comprising:
  a high-temperature superconducting bulk;
  a cooling means for cooling the high-temperature superconducting bulk;
  a vacuum insulated container surrounding the high temperature superconducting bulk and the cooling means;
  a magnetizing coil positioned such that the high-temperature superconducting bulk is within a magnetic field produced by the magnetizing coil;
  a space for placing a subject to be examined, positioned such that the subject is within a magnetic field produced by the high-temperature superconducting bulk; and
  a detector coil for detecting any nuclear magnetic resonance signals produced by the subject.

The high-temperature superconductor bulk that acts as the superconducting magnet comprises, as the essential component, superconductor oxide chemically represented by RE—Ba—Cu—O whereby RE indicates at least one or more of yttrium (elemental symbol, Y), samarium (Sm), lanthanum (La), neodymium (Nd), europium (Eu), gadolinium (Gd), erbium (Er) and ytterbium (Yb).

When yttrium-based, neodymium-based, samarium-based and other high-temperature superconductors having a superconducting transition temperature Tc of not lower than 90 K (Kelvin) are produced in a so-called melt process method where the starting material is once fused by overheating it at a temperature higher than its melting point and then again solidified, shaped bodies are obtained in which large crystals have grown. These are referred to as superconducting bulks. Fine grains of an insulating phase are dispersed throughout the bulk to form a texture of the matrix having superconductivity. The pinning points that result from the existence of the dispersed insulating phase trap magnetic flux. In this manner, the superconducting bulk acts as a pseudo-permanent magnet.

The superconducting bulk as produced in the melt process have a superconducting transition temperature falling between 90 K and 96 K and are characterized in that their texture comprises large crystals of a superconducting phase having a size of from 1 mm to 100 mm and fine grains of an insulating phase dispersed inside the large crystals and having a grain size of not larger than 50 μm (preferably, not larger than 10 μm).

The molar ratio of RE:Ba:Cu in the superconducting phase chemically represented by RE—Ba—Cu—O is 1:2:3 or so, while that in the insulating phase is 2:1:1 or so, though the elements may be mutually substituted with each other in some degree. In the superconducting bulks, the molar ratio of the superconducting phase to the insulating phase preferably falls between 10:1 and 1:1. If the insulating phase is smaller than 9% (i.e. if the molar ratio noted above oversteps 10:1), the sample will be greatly deformed when it is fused so that it could not retain the original shape which it had before heat treatment, or in other words the shapability of the sample is poor. On the other hand, if the insulating phase is larger than 50% (i.e. if the molar ratio noted above oversteps 1:1), the insulating phase will be the major phase and lower the superconducting characteristics of the bulks.

In producing the superconducting bulks, platinum (Pt) may be added thereto in an amount of from 0.1% to 10% for promoting fine dispersion of insulating phase grains in the texture of the bulks. The Platinum addition gives fine grains of an insulating phase having a grain size of not larger than 50 μm (preferably, not larger than 10 μm). In producing the superconducting bulks, silver (Ag) may also be added thereto in an amount of not larger than 50%. Silver may disperse in the texture of the bulks without greatly interfering with the capabilities of the superconducting phase in the superconducting bulks produced. Therefore, adding silver to the bulks retards the propagation of cracks to increase the mechanical strength of the bulks, and lowers the melting point of the bulks being produced to promote crystal growth in them. It also produces a temperature difference between the seed crystals and the bulks being produced to prevent the bulks from fusing such that silver has a positive influence on the crystal orientation in the bulks produced.

Depending on the crystal orientation therein, the superconductors have anisotropic superconductivity, in which the critical current density in the direction vertical to the c axis orientation of the crystal axis is higher than that in the other crystal orientation directions. Therefore, when they are monoaxially oriented only in the c axis orientation direction of the crystal axis, their ability to trap a magnetic field is good. Accordingly, when the superconducting bulks are so oriented that their c axis orientation direction is parallel to the direction in which they are magnetized in a magnetic field, then the magnetic field to be trapped by them could have excellent capabilities.

In the NMR system of the present invention the superconducting bulk is cooled in liquid nitrogen or in a cold head of a refrigerator to have a temperature not higher than its superconducting transition temperature. As the refrigerator, a small-sized refrigerator is preferably used. It may be selected from pulse tube refrigerators, GM cycle refrigerators, Solvay cycle refrigerators and Stirling refrigerators, any of which is favourable for cooling superconducting bulks as not requiring any complicated operation with a cryogen gases (liquid helium and liquid nitrogen).

The present invention also provides as method of operating a nuclear magnetic resonance system comprising:
a high-temperature superconducting bulk;
a cooling means;
a vacuum insulated container surrounding the high-temperature superconducting bulk and the cooling means;
a magnetizing coil; and
a detecting coil;
wherein the method comprises the steps of:
cooling the high-temperature superconducting bulk to a temperature not higher than its superconducting transition temperature;
applying a pulsed magnetic field to the cooled high-temperature superconducting bulk such that the high-temperature superconducting bulk operates as a permanent magnet;
placing a sample to be examined within the magnetic field produced by the high-temperature superconducting bulk; and
detecting nuclear magnetic resonance signals from the sample to be examined.

The magnetization of the superconducting bulk may also be effected applying a static magnetic field to the superconducting bulk whilst cooling the superconducting bulk to a temperature not higher than the superconducting transition temperature of the superconducting bulk.

In the NMR system of the invention, the magnetized superconducting bulk produces a magnetic field from inside the vacuum container where the bulk is housed to outside it, and the subject to be examined is put in and exposed to the magnetic field. Around the subject, a coil is disposed adjacent thereto, and the NMR signals are detected via an oscillation detector.

DETAILED DESCRIPTION OF THE PREFERRED EMBODIMENTS

Figure 1:
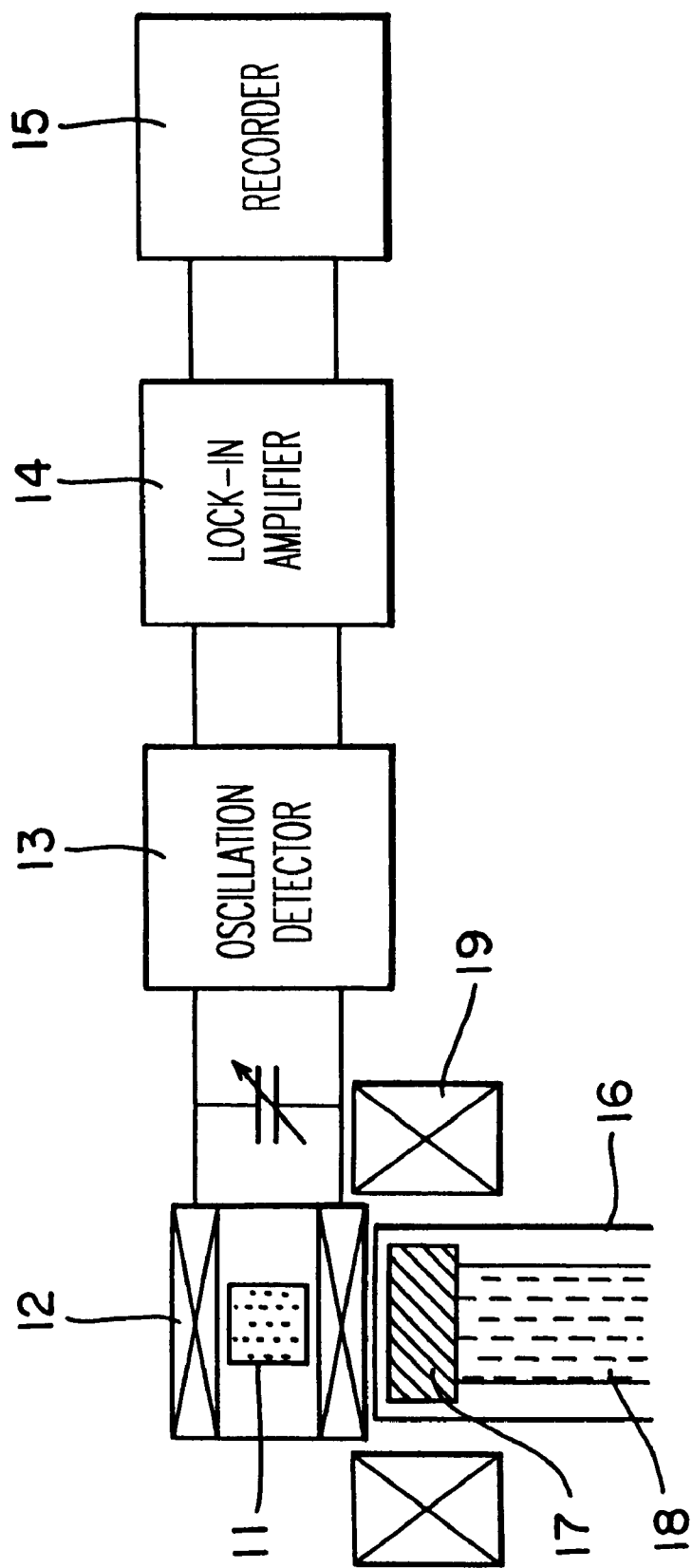
FIG. 1 is a cross-sectional view showing the basic principle of the NMR system of the invention.

Referring to FIG. 1, a substance 11 to be examined is placed inside a wound detector coil 12 and this is connected with a recorder 15 via a Robinson-type oscillation detector 13 for frequency sweeping and a lock-in amplifier 14. In the illustrated system, the NMR signals from the main magnetic field are detected and recorded in the recorder. The recorder is connected with a personal computer, in which the signals inputted are directly processed into NMR data and displayed, or imaged through MRI to give mapped information.

The substance 11 faces a superconducting bulk 17 housed in a vacuum insulated container 16, and the superconducting bulk 17 is fixed on a cold head 18 and is magnetized with a magnetizing coil 19 in an ultra-low-temperature superconducting condition.

The NMR system of the present invention operates as follows: The superconducting bulk in the vacuum container 16 is cooled, and while being cooled or after having been cooled, it is magnetized to form a permanent magnet. The magnetic field generated by the superconducting bulk depends on the critical current density for the bulk, which differs from the principle of conventional permanent magnets.

Though depending on the temperature to which the superconducting bulk is cooled, the largest magnetic field generated will be 2 T (tesla) at the liquid nitrogen temperature (77 K) or about 9 T at 25 K. This is much larger than that generated by conventional permanent magnets. At 25 K, the largest magnetic field generated by the superconducting bulk is far larger than that 2.5 T which conventional large-sized electromagnets could generate and is comparable to that to be generated by conventional superconducting magnets. The sensitivity and the space resolving power of NMR and MRI systems depend on the intensity of the magnetic field generated in the systems. Therefore, the capabilities of the NMR system of the present invention are good and comparable to those of other NMR systems comprising a conventional superconducting magnet, and any NMR systems comprising a permanent magnet or electromagnet could not attain such good capabilities.

The expensive liquid helium is replaced by a refrigerator or inexpensive liquid nitrogen, and thus the NMR system of the present invention is operated in a simplified manner and does not require any special operation technique. Therefore, the running cost for the system is low. In addition, the system is simple and can be easily popularized for in-site use for medical treatment and industrial production.

The superconducting bulk can be produced relatively inexpensively, for example, in a kind of sintering process, and its production does not require coiling and other complicated steps necessary for the production of superconducting wire. In principle, the superconducting bulk is also free from quenching that is intrinsic to coils of wire materials. Therefore, the magnetic field for the superconducting bulk can be designed, without considering at all the safety factor that are required for coils. For these reasons, the superconducting bulk is formed more inexpensively than superconducting coils.

The superconducting bulk behaves like a permanent magnet, and therefore can generate a magnetic field merely in the form of magnetic poles. Accordingly, the system that comprises the superconducting bulk is constructed in an extremely compact and lightweight form. Moreover, being different from that for coils, the heat capacity necessary for cooling the superconducting bulk is determined by the pole part only. Therefore, one favorable characteristic of the superconducting bulk is that its heat capacity is extremely small. As a result, even when a small-sized refrigerator, having a small amount of freezing power, or liquid nitrogen is used, the superconducting bulk can be cooled to a predetermined temperature within an extremely short time. The time is generally 1 or 2 hours, and is much shorter than the tens of hours necessary for cooling direct-cooling-type superconducting coils. This also enhances the stability of the system that may suffer from thermal disturbance occurring during operation and brings about the reduction in the overall size of the system and the total energy to be consumed by the system.

Since the system has neither a copper coil through which stationary current is passed nor a superconducting coil through which superconducting current is passed and since the superconducting bulk therein can be magnetized by only a simple magnetizing coil, the system requires no large-sized coil. Therefore, the overall weight of the system of the present is much lighter than that of systems comprising an electromagnet or superconducting magnet. Moreover, invention requires no iron core for forming a magnetic circuit. As opposed to this, systems comprising an electromagnet require an iron core in addition to the coil for the electromagnet. Therefore, the system of the invention is much more lightweight than the systems comprising an electromagnet. In addition, since the magnetic field generated by the superconducting bulk is much stronger than that generated by permanent magnets, the scale of the superconducting bulk may be smaller than that of permanent magnets. Therefore, as compared with systems comprising a permanent magnet, the system of the present invention is more lightweight.

The necessity for cooling water in the system of the present invention is reduced. Many small-sized refrigerators do not require cooling water. Even though large-sized refrigeratorss require cooling water, only a small amount of it may be used for cooling the compressor for them. In addition, since no stationary current is passed through the coil in the system of the present invention, the system does not require any large electric power for driving it. Therefore, the system has the advantage of reduced costs for cooling water and electric power.

Reducing the overall weight of the system of NMR or MRI broadens the condition for installing the system. The site where a conventional MRI system weighing 10 tons or larger could be installed is limited, as it requires high floor strength resistant to the weight. In addition, as producing a strong stray magnetic field, the conventional system is further problematic in that it requires a large and heavy magnetic shielding barrier. These limitations to the conventional system do not apply to the small-sized and lightweight system of the invention. Therefore, the present invention has realized the installation of inexpensive, compact and space-saving instruments for analysis.

In the system of the present invention, when the refrigerator is stopped and the temperature of the superconducting bulk rises and the superconducting bulk in a superconducting state is restored to its ordinary conductive state condition, and loses the function as a magnet. Therefore, for example, if the magnetic field has to be stopped in an emergency such as fire or the like, it can be stopped immediately. Constantly generating a strong magnetic field having an intensity of a few teslas is dangerous. Since the magnetic field generated by the superconducting bulk can be stopped at any desired time this ensures safe operation of the system, since it may produce a magnetic field only when desired. While the system is out of service or stopped on standby, the superconducting bulk may be kept generating no magnetic field.

One significant characteristic of the superconducting bulk for use in the present invention is that the magnetic field from the superconducting bulk can be used directly as the main magnetic field for MRI. Only a so-called single-side magnetic field to be radiated by the superconducting bulk could be used in the invention, and therefore the entire system of the invention including the detector coil can be freely designed in any desired manner. Accordingly, depending on the shape of the subject to be examined in the system, the most suitable coil form for the system can be designed. This increases the broad applicability of the invention.

According to the present invention, there is provided an instrument for analysis of a novel type for local MRI in a narrow space, which differs from conventional MRI systems that require a uniform magnetic field in a broad space. Using the superconducting micro-imaging system of the present invention makes it possible to analyze the partial structure and also the diseased part of, for example, fingers, hands and legs of animals and human beings, and to analyze the inner structure of industrial materials.

The present invention is described in more detail with reference to the following examples, which, however, are not intended to restrict the scope of the invention.

Figure 2:
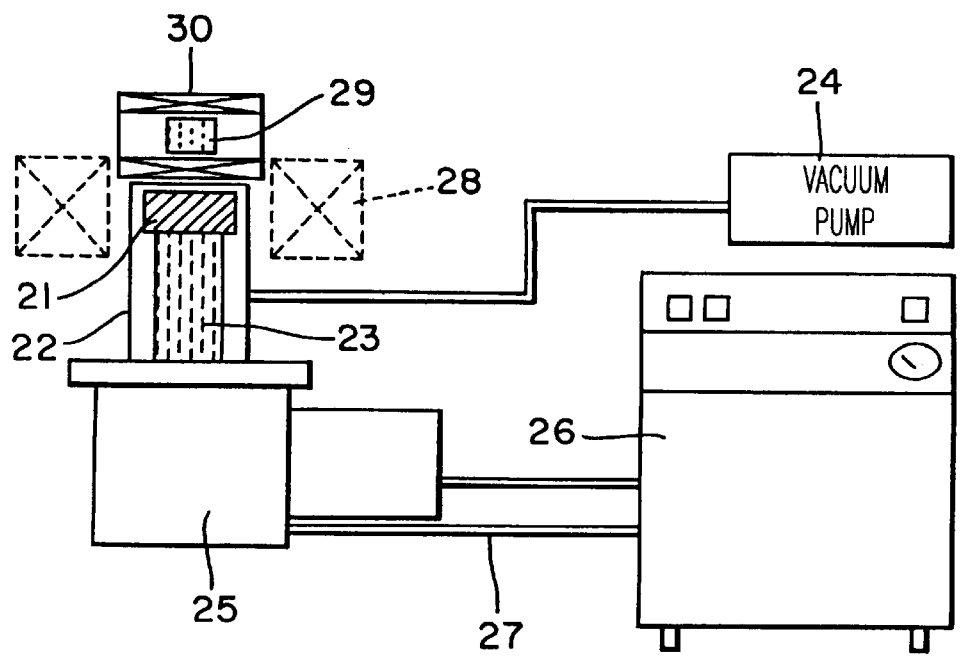
FIG. 2 is a cross-sectional view showing a first embodiment of the invention.

FIG. 2 shows a first embodiment of the present invention. A superconducting bulk 21 as shaped to have a columnar form is disposed inside a vacuum insulated container 22, and this is fixed on the cooling member 23 (cold head) of a refrigerator while being kept in contact therewith. In the system of this example, the refrigerator is a small-sized GM cycle refrigerator. The system body weighs 50 kg or so, which is much lighter than conventional systems comprising a superconducting magnet or electromagnet and generally weighing hundreds kilograms.

The container 22 is evacuated via a vacuum pump 24, and thermally insulated. In that condition, the refrigerator 25 and its compressor 26 are driven to lower the temperature of the superconducting bulk 21, whereby the bulk 21 is in a superconducting state. A magnetic field is applied to the bulk 21 from the outside of the vacuum container 22, whereby the bulk 21 is magnetized. For this, a small-sized magnetizing coil 28 is disposed outside the container 22, and a current from a capacitor is led into the coil 28 to produce a pulse magnetic field, in which the bulk is magnetized. As another means for magnetization, a conventional, helium-cooling-type superconducting magnet capable of producing a magnetic field of at most 10 T may be used, and the superconducting bulk may be cooled and magnetized in the static magnetic field produced by the magnet.

The magnetic field which the magnetized superconducting bulk traps and generates reaches at most 9 teslas on the surface of the bulk, which indicates that the bulk acts as a magnet capable of producing an extremely strong magnetic field. As examples, Y-based and Sm-based superconducting bulks were magnetized in a static magnetic field and a pulse magnetic field. The Y-based bulk is columnar, having a size of $\phi 35$ mm×15 mm; and the Sm-based bulk is also columnar, but having a size of $\phi 36$ mm×15 mm. The intensity of the magnetic field which the Y-based bulk trapped in a static magnetic field was 0.6 T at 77 K. With its temperature lowering, the magnetic field trapped by the Y-based bulk greatly increased as a result of the increase in Jc, and the intensity of the trapped magnetic filed reached above 5 T at 15 K. On the other hand, the pulse magnetization of the Y-based bulk gave 2.1 T at 30 K and above 2.5 T at 15 K. The Sm-based bulk had a magnetic field capacity of 2 T at 77 K, 9 T at 25 K.

Other rare earth-based superconducting bulks such as La (lanthanum)-based, Nd (neodymium)-based, Eu (europium)-based, Gd (gadolinium)-based, Er (erbium)-based and Yb (ytterbium)-based ones, may be used in addition to the Y-based and Sm-based bulks noted above.

In FIG. 2, a subject 29 to be examined is put in the magnetic field generated by the superconducting bulk 21, and inside a solenoid coil 30. The coil 30 is to impart a radio-frequency magnetic field to the subject 29, in the direction perpendicular to the main magnetic field to be imparted to the subject 29 in the vertical direction, and the magnetization change in that perpendicular direction is detected to measure NMR signals. In the illustrated system, the magnetic field to be generated by the superconducting is 10 times that from conventional permanent magnets. Therefore, the system ensures good detection of NMR signals with high accuracy.

The magnetic field from the superconducting bulk has a linear magnetic field profile such that its center part is the strongest while the remoter peripheral parts are weaker. Directly using the inclined magnetic field profile as it is makes it possible to identify the position of each part for MRI. The subject to which the system is applicable includes fingers, hands, legs and other parts of human body as well as parts of animals such as horses, etc. From the distribution condition of hydrogen, phosphorus and others in MRI, the system is applicable to sports medical treatment and to diagnosis of orthopedic disorders and diseases. In addition, the system is applicable to small animals in physiological animal experiments for observing tissue changes in those animals without dissecting them.

The system is also applicable to analysis of industrial materials of organic substances, organic membranes and inorganic substances for detecting water therein and for clarifying chemical element dispersion, without dissecting or disrupting them. In particular, the system may be used for analyzing tubular or rod-like organic materials and farm crops for detecting inner defects which may exist and even for identifying their structures, all in a simplified manner. To that effect, the present invention that provides such an extremely inexpensive and compact NMR system enlarges the applicability of the system to the field of general industry in which using conventional, expensive superconducting magnets is quite unprofitable.

Figure 3:
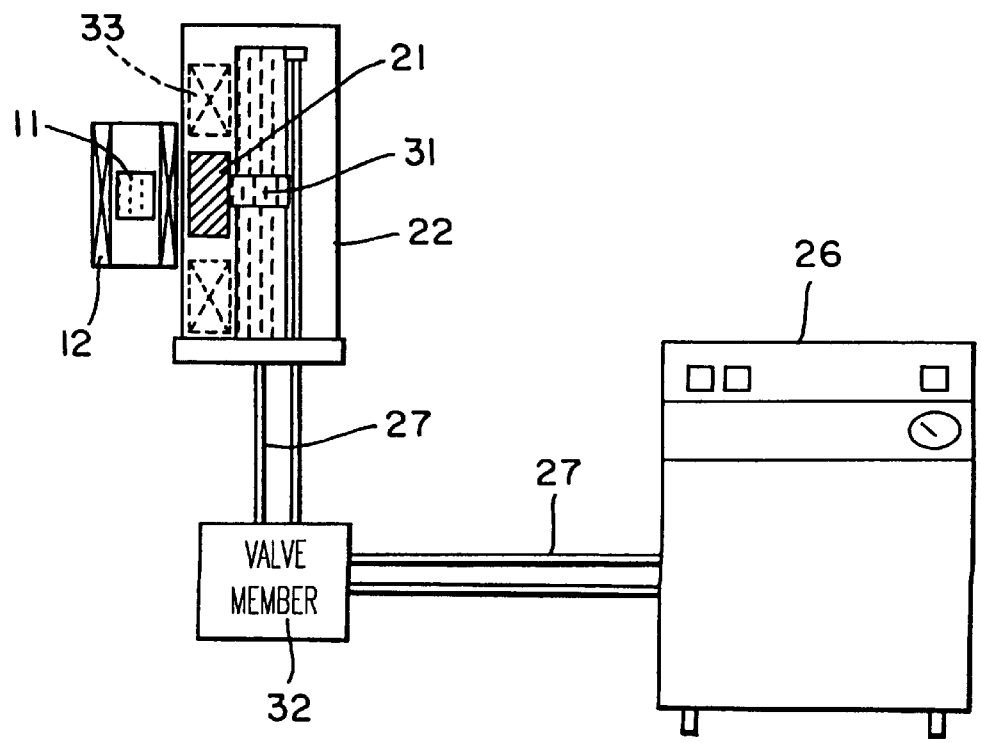
FIG. 3 is a cross-sectional view showing a second embodiment of the invention.

FIG. 3 shows a second embodiment of the present invention, in which the superconducting bulk 21 is cooled with a pulse tube refrigerator. The superconducting bulk 21 is fixed on a cooling member 31 (cold head) of the pulse tube cooler. The container is evacuated via a vacuum pump (not shown), and the compressor 26 for the cooler is driven to start cooling. The compressor 26 is connected with the valve member 32 and the cooling member 31 via a connecting duct 27. After having been cooled, the superconducting bulk 21 is magnetized with a magnetizing coil 33.

Being independent of the valve member, the pulse tube cooler is advantageous in that the vibration of the cooling member is reduced and therefore the magnetic pole of the superconducting bulk is not vibrated. Accordingly, highly accurate position detection is possible in the system, and the system has improved capabilities for MRI. In addition, since the freezing power of the refrigerator is high, the superconducting bulk can be cooled even to temperatures lower than 30 K. Therefore, in this system, the capabilities of the magnetic field to be generated by the superconducting bulk are improved, and the system can exhibit improved performance.

Figure 4:
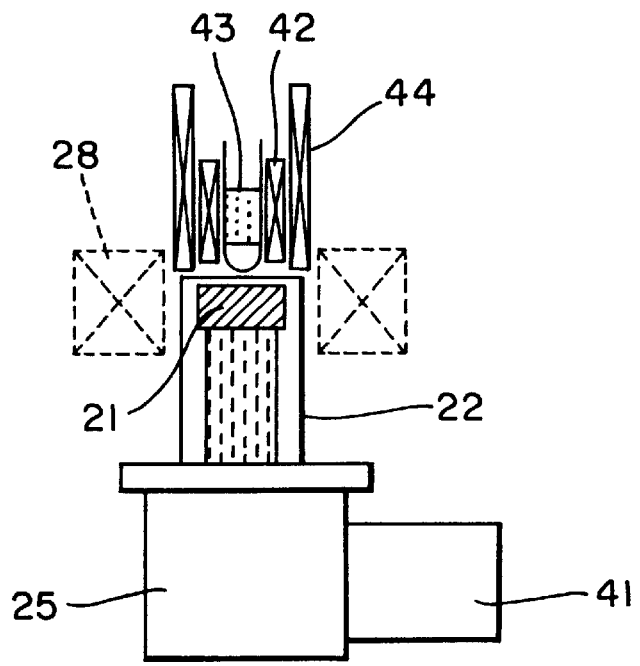
FIG. 4 is a cross-sectional view showing a third embodiment of the invention.

FIG. 4 shows a third embodiment of the invention, in which NMR signals are detected by the use of a Helmholtz coil 42. A subject 43 to be examined is disposed above the superconducting bulk 21 to be cooled with a GM cycle refrigerator, and a Helmholtz coil 42 is disposed around the subject 43 with its axis being perpendicular to the direction of the main magnetic field. The coil is combined with a variable capacitor and is oscillated at radio frequency 10 to 30 MHz. The basic turning circuit in the system is engaged with a variable capacitor, and the voltage at its both ends is thereby varied to enable a frequency sweep whereby is obtained the position information on the subject 43 being examined in the system. In addition, a magnetic field modulation coil 44 is disposed around the coil 42, by which the magnetic field is modulated at audio frequency. The audio frequency may be any of 35 Hz, 80 Hz or 400 Hz.

In the system having the illustrated arrangement, a human palate, for example, may be put into the main magnetic field and even dental diagnosis is possible. In addition, the macroscopic tissue of a long-size, sheet-like organic or inorganic material can be inspected through MRI in the system. Moreover, like in the NMR systems of the first and second embodiments the molecular structures of organic solutions or proteins can be determined in the NMR system of this Example.

Figure 5:
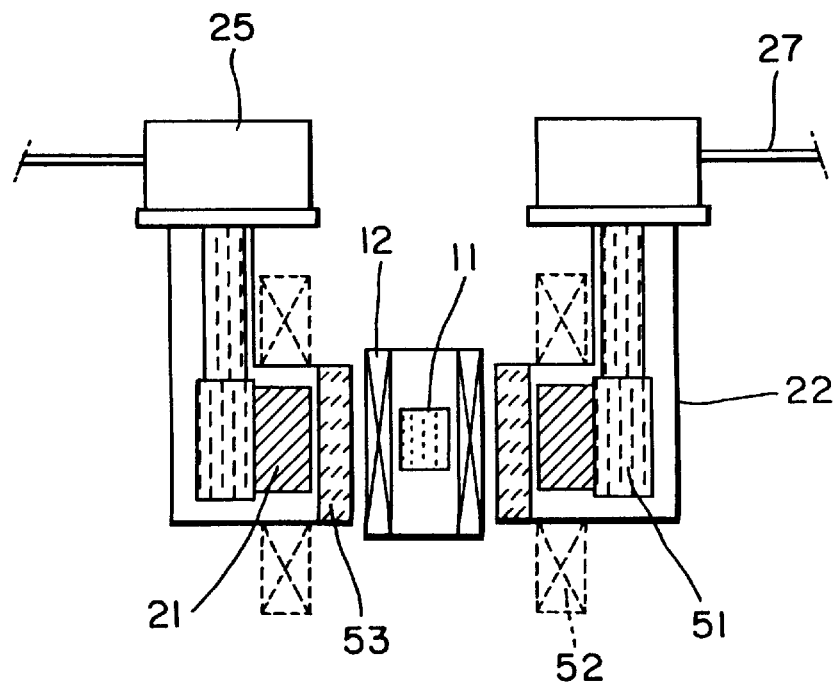
FIG. 5 is a cross-sectional view showing a fourth embodiment of the invention.

FIG. 5 shows a fourth embodiment of the present invention, in which a plurality of magnetic fields to be generated by a plurality of superconducting bulks are combined. In this embodiment, a coaxial pulse tube refrigerator is used, and each superconducting bulk 21 is fixed on the cooling member 51 of the cooler. After having been cooled to an ultra-low temperature and then magnetized with a magnetizing coil 52, each bulk 21 generates a magnetic field while acting as a permanent magnet. The magnetic field is applied to the subject 11 to be examined in the system, in which the NMR signals in the direction perpendicular to the main magnetic field are collected via the solenoid coil 12.

In the illustrated system, since the magnetic poles of plural bulks face each other, plural magnetic fields as generated by those bulks are superimposed on each other to give a stronger magnetic field. Accordingly, in the system, high-sensitivity detection in the stronger magnetic field is possible. Moreover, since the magnetic field is symmetrically distributed relative to the center of the subject 11, more accurate composition analysis and structure analysis through NMR is possible in the system. In addition, the MRI capabilities of the system are much improved.

To control the distribution of the magnetic field as radiated in the space, iron yokes 53 may be employed, as in FIG. 5. Where the uniformity of the space magnetic field is desired in the system in which the intensity of the magnetic field is not higher than 2 T, the yokes can produce a magnetic field with good uniformity between them. The system of the illustrated type is applicable to high-performance NMR spectroscopy.

The body weight of the pulse tube refrigerator used herein is only 5 kg or less, and using such a lightweight pulse tube refrigerator for cooling the superconducting bulk in the invention enables the bulk to generate a strong magnetic field of a few teslas or so. As compared with conventional strong magnetic field-generating devices (helium-cooled superconducting magnets, electromagnets), the superconducting bulk for use in the invention is much more small-sized, lightweight and compact, and has much better capabilities.

What is claimed is:

1. A nuclear magnetic resonance apparatus comprising:
   a high-temperature superconductive bulk;
   a cooling means for cooling the high-temperature superconductive bulk;
   a vacuum insulated container surrounding the high-temperature superconductive bulk and the cooling means;
   a magnetizing coil positioned such that the high-temperature superconductive bulk is within a magnetic field produced by the magnetizing coil;
   a space for placing a subject to be examined, positioned such that the subject is within a magnetic field produced by the high-temperature superconductive bulk; and
   a detector coil for detecting nuclear magnetic resonance signals produced by the subject.

2. A nuclear magnetic resonance apparatus according to claim 1, wherein the high-temperature superconductive bulk comprises:
   crystals of a superconductive phase of superconductor oxide; and
   fine grains of an insulating phase dispersed throughout the superconductive bulk, the superconductive bulk being produced by melting superconductor oxide chemically at a temperature higher than its melting point and then being solidified.

3. A nuclear magnetic resonance apparatus according to claim 2, wherein the superconductor oxide is chemically represented by RE—Ba—Cu—O, such that RE is at least one of yttrium (Y), samarium (Sm), lanthanum (La), neodymium (Nd), europium (Eu), gadolinium (Gd), erbium (Er) and ytterbium (Yb), and has a superconductive transition temperature between 90 K and 96 K.

4. The nuclear magnetic resonance apparatus according to claim 3, wherein the molar ratio of RE:Ba:Cu of the superconductor oxide is 1:2:3.

5. A nuclear magnetic resonance apparatus according to claim 4, wherein the molar ratio of superconductive phase to insulating phase is between 10:1 and 1:1.

6. A nuclear magnetic resonance apparatus according to claim 5, wherein the insulating phase has a grain size not larger than 50 μm.

7. A nuclear magnetic resonance apparatus according to claim 6, wherein the superconductive phase has a crystal size of between 1 mm and 100 mm.

8. A nuclear magnetic resonance apparatus according to claim 1, wherein the high-temperature superconductive bulk is the shaped body of a single crystal consisting essentially of a superconducting phase or an aggregate of a pulrality of single crystals.

9. A nuclear magnetic resonance apparatus according to claim 1, wherein the high-temperature superconductor bulk is orientated so that the c axis orientation direction of the crystals forming the high-temperature superconductor bulk is parallel to the direction in which the high-temperature superconductor bulk is magnetized in the magnetic field.

10. A nuclear magnetic resonance apparatus according to claim 1, wherein the superconductive bulk also includes platinum (Pt).

11. A nuclear magnetic resonance apparatus according to claim 1, wherein the superconductive bulk also includes silver (Ag).

12. A nuclear magnetic resonance apparatus according to claim 1, wherein the cooling means is liquid nitrogen.

13. A nuclear magnetic resonance apparatus according to claim 1, wherein the cooling means is a cooling member of a refrigerator.

14. A nuclear magnetic resonance apparatus according to claim 13, wherein the refrigerator is one of a pulse tube refrigerator, a GM cycle refrigerator, a Solvay cycle refrigerator and a Stirling refrigerator.

15. A nuclear magnetic resonance apparatus according to claim 1, wherein an iron yoke is disposed between the magnetizing coil and the high-temperature superconductive bulk.

16. A nuclear magnetic resonance apparatus according to claim 1, wherein the magnetizing coil is disposed inside the vacuum insulated container.

17. A method of operating a nuclear magnetic resonance system comprising:
   a high-temperature superconductive bulk;
   a cooling means;
   a vacuum insulated container surrounding the high-temperature superconductive bulk and the cooling means;
   a magnetizing coil; and
   a detecting coil;
   wherein the method comprises the steps of:
   cooling the high-temperature superconductive bulk to temperature not higher than its superconductive transition temperature;

applying a pulsed magnetic field to the cooled high-temperature superconductive bulk such that the high-temperature superconductive bulk operates as a permanent magnet;

placing a sample to be examined within the magnetic field produced by the high-temperature superconductive bulk; and detecting nuclear magnetic resonance signals from the sample to be examined.

18. The method of claim 17, wherein the high-temperature superconductive bulk comprises:

crystals of a superconductive phase of superconductor oxide; and fine grains of an insulating phase dispersed throughout the superconductive bulk, the superconductive bulk being produced by melting superconductor oxide chemically at a temperature higher than its melting point and then being solidified.

19. A method of operating a nuclear magnetic resonance system comprising:

a high-temperature superconductive bulk;

a cooling means;

a vacuum insulated container surrounding the high-temperature superconductive bulk and the cooling means;

a magnetizing coil; and a detecting coil;

wherein the method comprises the steps of;

applying a static magnetic field to the high-temperature superconductive bulk;

cooling the high-temperature superconductive bulk to a temperature not higher than its superconductive transition temperature, in the static magnetic field, such that the high-temperature superconductive bulk operates as a permanent magnet;

placing a sample to be examined within the magnetic field produced by the high-temperature superconductive bulk; and detecting nuclear magnetic resonance signals from the sample to be examined.

20. The method of claim 19, wherein the high-temperature superconductive bulk comprises:

crystals of a superconductive phase of superconductor oxide; and fine grains of an insulating phase dispersed throughout the superconductive bulk, the superconductive bulk being produced by melting superconductor oxide chemically at a temperature higher than its melting point and then being solidified.

21. A nuclear magnetic resonance spectrometer including a high-temperature superconductor cooled in a vacuum insulated container and imparting a magnetic field thereto, wherein a supercurrent passing through it is produced, thereby trapping the magnetic field to be a magnetic field supply member capable of producing a main magnetic field in the system, and NMR signals from the subject to be examined and put in the main magnetic field thus produced by the magnetic field supply member are detected with a detector coil as disposed adjacent to the subject and with an already existing spectrometer.

22. The nuclear magnetic resonance system as claimed in claim 21, wherein the high-temperature superconductive bulk comprises, as the essential component, an oxide superconductor to be represented by RE—Ba—Cu—O, with RE indicating at least one or more of Y, Sm, La, Nd, Eu, Gd, Er and Yb, and this has a superconductive transition temperature falling between 90 K and 96 K in terms of the absolute temperature scale has a texture that comprises a superconductive phase and fine grains of an insulating phase of an allotropy as dispersed inside the superconductive phase and having a grains size of not larger than 50 $\mu$m, the superconductive bulk being produced by melting said oxide superconductor chemically at a temperature higher than its melting point and then being solidified.

23. The nuclear magnetic resonance spectrometer as claimed in claim 22, wherein the high-temperature superconductive bulk is in the form of a shaped body of a single crystal consisting essentially of a superconductive phase and having a size of from 1 mm to 100 mm or of an aggregate of a plurality of such crystals.

24. The nuclear magnetic resonance spectrometer as claimed in claim 23, wherein the high-temperature superconductive bulk is so oriented that the c axis orientation direction of the crystal(s) constituting it is parallel to the direction in which it is magnetized in the magnetic field.

25. The nuclear magnetic resonance spectrometer as claimed in claim 24, wherein the high-temperature superconductive bulk is cooled in liquid nitrogen or by the cooling member of a small-sized refrigerator selected from pulse tube refrigerators, GM cycle refrigerators, Solvay cycle refrigerators and Stirling refrigerators, to a temperature not higher than its superconductive transition temperature.

26. The nuclear magnetic resonance spectrometer as claimed in claim 25, wherein the impartation of the magnetic field to the high-temperature superconductive bulk is effected in a pulse magnetic field.

27. The nuclear magnetic resonance spectrometer as claimed in claim 25, wherein the impartation of the magnetic field to the high-temperature superconductive bulk is effected in a static magnetic field.

28. A nuclear magnetic resonance spectrometer comprising a magnet of a high-temperature superconductive bulk as supported by the cooling member of a refrigerator and disposed in a vacuum insulated container, a magnetizing coil that surrounds said magnet, a space for the subject to be examined which is so disposed that it faces said magnet, and a detector coil as disposed around said space, wherein the NMR signals produced are detected via an oscillation detector as connected with the detector coil.

29. The nuclear magnetic resonance system as claimed in claim 28, wherein the high-temperature superconductive bulk comprises, as the essential component, an oxide superconductor of RE—Ba—Cu—O with RE indicating one or more of Y, Sm, La, Nd, Eu, Gd, Er and Yb, the superconductive bulk being produced by melting said oxide superconductor chemically at a temperature higher than its melting point and then being solidified.

30. The nuclear magnetic resonance spectrometer as claimed in claim 28, wherein an iron yoke is disposed between the magnetizing coil and the magnet.

31. The nuclear magnetic resonance spectrometer as claimed in claim 28, wherein the magnetizing coil is disposed inside the vacuum insulated container.

* * * * *